(12) United States Patent
Hong et al.

(10) Patent No.: US 9,661,752 B2
(45) Date of Patent: May 23, 2017

(54) CIRCUIT ARRANGEMENT WITH SHUNT RESISTOR

(75) Inventors: Tao Hong, Soest (DE); Markus Thoben, Soest (DE)

(73) Assignee: Infineon Technologies AG, Neubiberg (DE)

( * ) Notice: Subject to any disclaimer, the term of this patent is extended or adjusted under 35 U.S.C. 154(b) by 1455 days.

(21) Appl. No.: 13/163,200

(22) Filed: Jun. 17, 2011

(65) Prior Publication Data

US 2011/0310568 A1     Dec. 22, 2011

(30) Foreign Application Priority Data

Jun. 21, 2010  (DE) .................. 10 2010 030 317

(51) Int. Cl.
*H05K 7/00*  (2006.01)
*H05K 1/18*  (2006.01)
(Continued)

(52) U.S. Cl.
CPC ............. *H05K 1/181* (2013.01); *G01R 1/203* (2013.01); *H01L 23/647* (2013.01); *H01L 25/072* (2013.01); *H01L 25/16* (2013.01); *H01L 25/18* (2013.01); *H01L 24/45* (2013.01); *H01L 24/48* (2013.01); *H01L 24/49* (2013.01); *H01L 24/73* (2013.01); *H01L 24/83* (2013.01); *H01L 27/0207* (2013.01); *H01L 28/20* (2013.01); *H01L 2224/29339* (2013.01); *H01L 2224/32225* (2013.01); *H01L 2224/45014* (2013.01); *H01L 2224/45124* (2013.01); *H01L 2224/45147* (2013.01); *H01L 2224/4847* (2013.01);
(Continued)

(58) Field of Classification Search
USPC .......................................................... 361/728
See application file for complete search history.

(56) References Cited

U.S. PATENT DOCUMENTS 4,740,485 A *  4/1988  Sharpe-Geisler ............. 438/601
5,214,407 A *  5/1993  McKim et al. .................. 338/49
(Continued)

FOREIGN PATENT DOCUMENTS

DE           10230156 A1     1/2004
DE     102008035993 A1     2/2010

*Primary Examiner* — David M Sinclair
*Assistant Examiner* — Theron S Milliser
(74) *Attorney, Agent, or Firm* — Murphy, Bilak & Homiller, PLLC

(57) ABSTRACT

A circuit arrangement has a populated circuit carrier and includes a flat insulation carrier having a top side and a patterned metallization layer on the top side and a first power semiconductor chip arranged on a first section of the metallization layer. The first power semiconductor chip has a first lower chip load terminal electrically conductively connected to the first section. A shunt resistor is arranged on a second section of the metallization layer. The shunt resistor has a lower main terminal electrically conductively connected to the second section. An electrically conductive connection is provided between the first section and the second section. The electrically conductive connection includes a constriction between the first section and the second section so that a current which flows between the first lower chip load terminal and the lower main terminal during operation of the circuit arrangement must pass through the constriction.

20 Claims, 11 Drawing Sheets

(51) Int. Cl.
*G01R 1/20* (2006.01)
*H01L 23/64* (2006.01)
*H01L 25/07* (2006.01)
*H01L 25/16* (2006.01)
*H01L 25/18* (2006.01)
*H01L 23/00* (2006.01)
*H01L 27/02* (2006.01)
*H01L 49/02* (2006.01)
*H05K 3/22* (2006.01)

(52) U.S. Cl.
CPC ............... *H01L 2224/48091* (2013.01); *H01L 2224/48227* (2013.01); *H01L 2224/48472* (2013.01); *H01L 2224/49111* (2013.01); *H01L 2224/49171* (2013.01); *H01L 2224/49175* (2013.01); *H01L 2224/73265* (2013.01); *H01L 2224/8382* (2013.01); *H01L 2224/8384* (2013.01); *H01L 2224/85205* (2013.01); *H01L 2924/00011* (2013.01); *H01L 2924/01004* (2013.01); *H01L 2924/014* (2013.01); *H01L 2924/01013* (2013.01); *H01L 2924/01014* (2013.01); *H01L 2924/01015* (2013.01); *H01L 2924/01019* (2013.01); *H01L 2924/01047* (2013.01); *H01L 2924/0781* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01); *H01L 2924/19105* (2013.01); *H01L 2924/19107* (2013.01); *H01L 2924/30107* (2013.01); *H05K 3/222* (2013.01); *H05K 2201/0969* (2013.01); *H05K 2201/09663* (2013.01); *H05K 2201/10022* (2013.01); *H05K 2201/10166* (2013.01); *H05K 2203/173* (2013.01); *Y02P 70/611* (2015.11)

(56) References Cited

U.S. PATENT DOCUMENTS

| | | | | |
|---|---|---|---|---|
| 5,451,818 | A * | 9/1995 | Chan et al. | 257/728 |
| 5,668,408 | A * | 9/1997 | Nicholson | 257/699 |
| 5,761,040 | A * | 6/1998 | Iwasa et al. | 361/704 |
| 5,953,811 | A * | 9/1999 | Mazzochette | 29/612 |
| 6,292,091 | B1 * | 9/2001 | Kambara et al. | 338/195 |
| 6,359,331 | B1 * | 3/2002 | Rinehart et al. | 257/691 |
| 6,925,704 | B1 * | 8/2005 | Schneekloth et al. | 29/610.1 |
| 7,570,008 | B2 * | 8/2009 | Inaba et al. | 318/722 |
| 7,772,694 | B2 * | 8/2010 | Tang | 257/728 |
| 7,842,546 | B2 * | 11/2010 | Tang | 438/106 |
| 8,514,579 | B2 * | 8/2013 | Stolze et al. | 361/728 |
| 2003/0038706 | A1 | 2/2003 | Nakatsu et al. | |
| 2003/0090241 | A1 * | 5/2003 | Nakatsu et al. | 322/27 |
| 2005/0035434 | A1 * | 2/2005 | Fissore et al. | 257/666 |
| 2011/0044012 | A1 * | 2/2011 | Matsumoto | 361/728 |
| 2011/0051375 | A1 * | 3/2011 | Ammar | 361/728 |

* cited by examiner

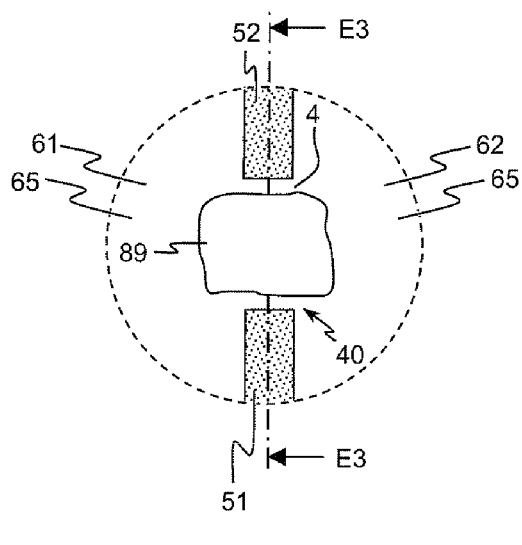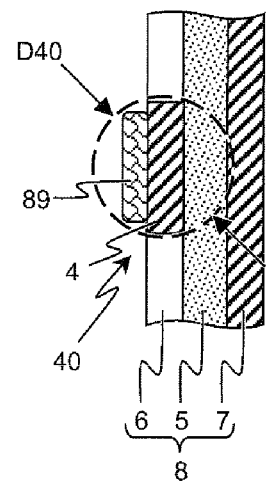
FIG 12A  FIG 12B
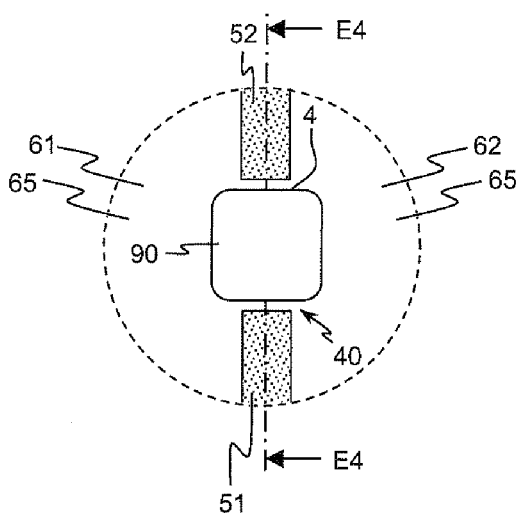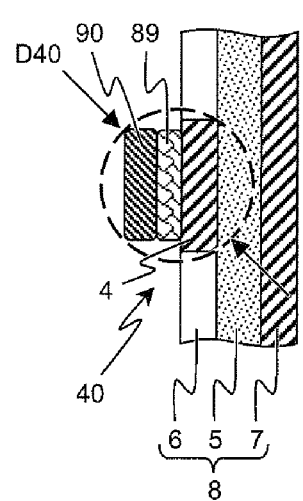
FIG 13A  FIG 13B

CIRCUIT ARRANGEMENT WITH SHUNT RESISTOR

PRIORITY CLAIM

This application claims priority to German Patent Application No. 10 2010 030 317.8 filed on 21 Jun. 2010, the content of said application incorporated herein by reference in its entirety.

TECHNICAL FIELD

The instant application relates to resistance measurement by means of a shunt resistor.

BACKGROUND

Shunt resistors have two terminals, which are designated hereinafter as main terminals, by means of which a resistance element is connected in series with a current to be measured. By determining the voltage dropped across the resistance element, in conjunction with the known resistance value of the resistance element, it is possible to determine the load current flowing between the main terminals. In order to obtain a highest possible measurement accuracy in this case, in principle a highest possible measurement voltage is desirable, which requires a high resistance value. On the other hand, however, the resistance value is intended to be kept as low as possible, since the power loss rises proportionally to the resistance of the resistance element. Apart from the fact that high power losses are inherently undesirable if only owing to the evolution of heat associated therewith, such evolution of heat also alters the current-voltage characteristic curve of the resistance element. Consequently, in practice, it is always necessary to find a middle course between a power loss that is just still permissible and the required measurement accuracy. However, it is not always possible to find a compromise in which all competing boundary conditions are satisfactorily fulfilled.

This is aggravated by the fact that the currents to be measured in a circuit arrangement with a shunt resistor, for example if the currents flow in the conductor plane of a printed circuit board, can vary with regard to their current distribution over the conductor plane in a manner dependent on the respective circuit state, such that the result of a current measurement is greatly dependent on the current distribution in the respective circuit state of the circuit arrangement. Thus, in the case of circuit arrangements in power semiconductor modules comprising a bridge circuit, current-direction-dependent deviations of the measured current value from the actual current value of up to 2% have been determined. However, it would be desirable to achieve deviations of 1% or less.

In the manufacture of a plurality of identical circuit arrangements having, in particular, assemblies for current measurement with a shunt resistor, measurement inaccuracies can likewise occur. In the ideal case, the taps by which the voltage dropped across the shunt resistor is tapped off are fitted exactly at correspondingly identical locations in the different circuit arrangements. In practice, however, deviations from the ideal case arise on account of unavoidable manufacturing tolerances, such that, in the different circuit arrangements with analogously identical potential tapping in each case, with otherwise identical construction and identical energization conditions of the different circuit arrangements, different potentials are tapped off.

Furthermore, conventional shunt resistors typically have two main terminals, which are both soldered via the metallization of a circuit carrier. Such a construction requires a large amount of space on the circuit carrier, which is manifested in the costs. This is relevant primarily when an expensive ceramic substrate is used as the circuit carrier. Moreover, mounting such a shunt resistor on the circuit carrier requires a dedicated process technology, which likewise increases the manufacturing outlay and the production costs. Moreover, shunt resistors require a longer energization path on account of their design, as a result of which the inductance is significantly increased. As a result, however, particularly in fast switching operations, high induced voltages can occur, which can corrupt the measurement signal tapped off at the shunt resistor.

SUMMARY

According to an embodiment, a circuit arrangement includes a shunt resistor which enables a precise current measurement with the shunt resistor and in which the shunt resistor takes up as little space as possible and which can be manufactured with little outlay. According to another embodiment, a power semiconductor module includes a circuit arrangement of this type.

Embodiments described herein provide a circuit arrangement with a populated circuit carrier. The circuit arrangement includes a flat insulation carrier having a top side and a patterned metallization layer on the top side and a first power semiconductor chip arranged on a first section of the metallization layer. The first power semiconductor chip has a first lower chip load terminal electrically conductively connected to the first section. A shunt resistor is arranged on a second section of the metallization layer. The shunt resistor has a lower main terminal electrically conductively connected to the second section. An electrically conductive connection is provided between the first section and the second section. The electrically conductive connection includes a constriction between the first section and the second section so that a current which flows between the first lower chip load terminal and the lower main terminal during operation of the circuit arrangement must pass through the constriction.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 2B shows a circuit arrangement with the circuit carrier shown in FIG. 2A after the circuit carrier has been populated with two power semiconductor chips and a shunt resistor.

FIG. 12A shows an alternative configuration of the arrangement in accordance with FIGS. 11A to 11C, in which the constriction is bridged by a solder.

FIG. 12B shows a vertical section through the circuit arrangement according to FIG. 12A in a sectional plane E3.

FIG. 13A shows an alternative configuration of the arrangement in accordance with FIGS. 11A to 11C, in which the bridging is bridged by a metal lamina soldered across the constriction.

FIG. 13B shows a vertical section through the circuit arrangement in accordance with FIG. 13A in a sectional plane E4.

DETAILED DESCRIPTION

Figure 1:
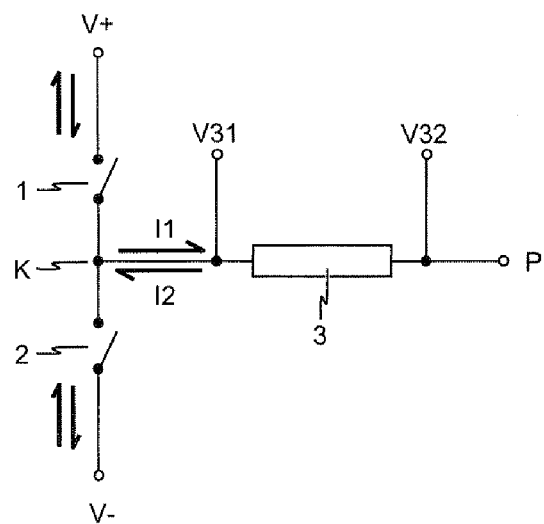
FIG. 1 shows a basic circuit diagram of a circuit arrangement with a shunt resistor, which circuit arrangement can assume different switching states in which current flows through the shunt resistor in different directions.

FIG. 1 shows a circuit diagram of a circuit arrangement with a shunt resistor. The circuit arrangement can assume different switching states, on the basis of the example of a half-bridge such as is used in converters, for example. The half-bridge has two switching elements 1 and 2 electrically connected in series, which can be, for example, controllable power semiconductor switches such as MOSFETs (metal oxide semiconductor field effect transistors), IGBTs (insulated gate bipolar transistors), J-FETs (junction field effect transistors), thyristors, diodes or any other switching elements. At the circuit node labeled 'K' in FIG. 1 between the series-connected switching elements 1 and 2, the half-bridge provides an electrical potential for the operation of a load to be connected to a phase output P. This potential is dependent, in particular, on the switching states of the switching elements 1 and 2.

In order to measure the load current, a shunt resistor 3 is provided, which is connected to the circuit node K at one end and to the phase terminal P at the other end. Moreover, a first potential terminal V31 and second potential terminal V32 are provided in order to determine the voltage dropped across the shunt resistor 3.

When the first switching element 1 is closed and the second switching element 2 is open, the potential V+ is present at the circuit node K, which brings about a current I1 between the circuit node K and the phase terminal P, the current being directed from the circuit node K in the direction of the phase terminal P. By contrast, when the switching element 1 is open and the switching element 2 is closed, the potential V− is present at the circuit node K, which results in a current I2 directed from the phase terminal P to the circuit node K. The current I2 is thus directed oppositely to the current I1.

Depending on the geometry of the circuit layout, the current distribution is dependent on the direction of the respective current I1 or I2, such that the magnitude of the voltage drop across the shunt resistor 3, that is to say the magnitude of the potential difference between the first potential terminal V31 and the second potential terminal V32, can be different for the currents I1 and I2, even if the magnitudes thereof are identical.

The current-direction-dependent deviation of the voltage drop across the shunt resistor is significant primarily when the circuit is constructed on a printed circuit board having large-area conductor tracks that allow a current-direction-dependent different distribution of the magnitudes of the currents. In order to increase the measurement accuracy during a current measurement with a shunt resistor 3, for a circuit as shown by way of example in FIGS. 2A to 2D, a circuit arrangement is illustrated which can be used to reduce the current-direction-dependent measurement inaccuracy during the detection of the current through the shunt resistor.

Figure 2A:
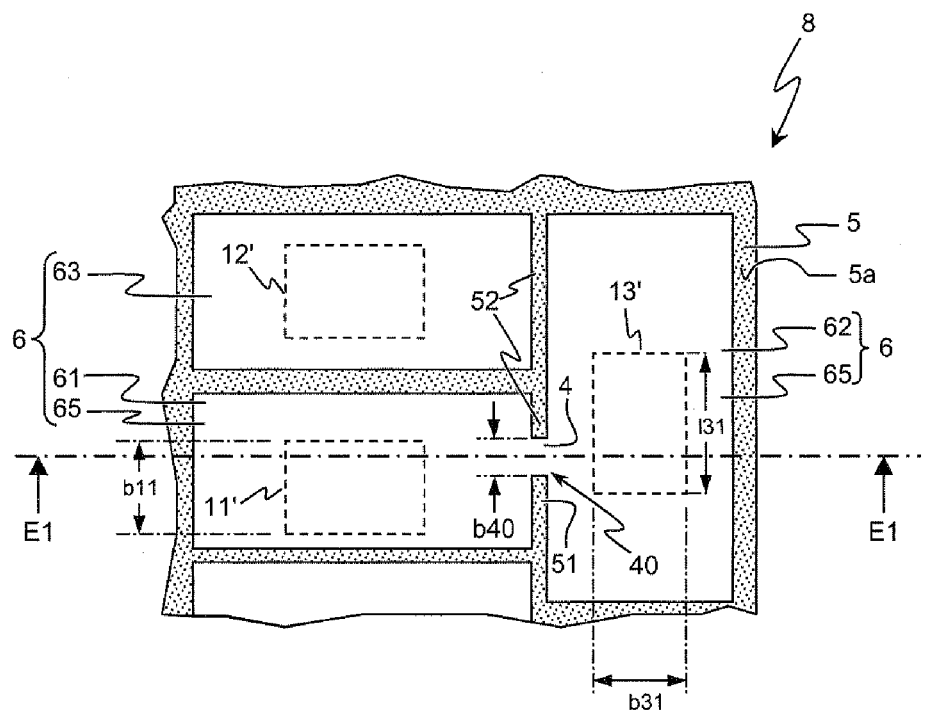
FIG. 2A shows a circuit carrier with a patterned metallization layer, which has two sections electrically conductively connected to one another via a constriction of the metallization layer, one of the sections being populated with a power semiconductor chip and the other with a shunt resistor.

FIG. 2A shows in plan view an unpopulated circuit carrier 8 having a dielectric insulation carrier 5 with a top side 5a, to which an upper, patterned metallization layer 6 is applied. The circuit carrier 8 thus forms a printed circuit board. The upper metallization layer 6 has a first section 61, a second section 62 and a third section 63. The sections 61 and 62 are connected to one another by an electrically conductive connection 4. In the embodiment shown, the electrical connection 4 is realized within the upper metallization layer 6, such that the sections 61 and 62 form parts of a continuous section 65 of the upper metallization layer 6.

In this embodiment, the electrically conductive connection 4 runs completely at the level of that side of the shunt resistor 3 which faces the conductive connection 4. To put it another way, the shunt resistor 3 is situated between the two extensions of the lateral sides of the shunt resistor 3 which are adjacent to the (likewise lateral) side of the shunt resistor 3 which faces the constriction 40.

Mounting areas 11', 13' and 12'—illustrated by dashed lines—are respectively identified on the sections 61, 62, 63. The mounting areas 11' and 12' are provided, as is evident in conjunction with FIG. 2B, for mounting a first power semiconductor chip 1 and a second power semiconductor chip 2, respectively, on them. The third mounting area 13' is correspondingly provided for mounting a shunt resistor 3. The electrically conductive connection 4 is configured, then, such that it forms a constriction 40 between the sections 61 and 62 of the continuous section 65. On account of the constriction 40, an electric current between a first power semiconductor chip 1 mounted on the mounting area 11' and a shunt resistor 3 mounted on the third mounting area 13' passes through the electrically conductive connection 4 at the constriction 40, to be precise independently of the current direction. Consequently, the potential linking of the shunt resistor 3 and, associated with that, the current distribution within the second section 62, in comparison with conventional circuit arrangements, are dependent on the current direction to a significantly lesser extent than in corresponding conventional arrangements without such a constriction. The constriction 40 can have a minimum width b40, which, for example, can be in the range of less than 90% of the length l31 of the shunt resistor 3. The length l31 of the shunt resistor 3 and the width b3 thereof are in each case measured parallel to the top side 5a of the insulation carrier 5 and in mutually perpendicular directions, wherein the length l31 is greater than the width b3. Optionally, the width b40 can be chosen to be greater than 650 μm in order to achieve a certain minimum current-carrying capacity.

Alternatively or additionally, the width b40 of the constriction 40 can be chosen both to be less than the smallest width b11 of the first lower chip load terminal 11, and to be less than the smallest width b31 of the lower main terminal 31, wherein the widths b40, b11 and b31 are in each case determined parallel to the top side 5a of the insulation carrier 5.

FIG. 2B shows the circuit carrier 8 illustrated in FIG. 2A after the circuit carrier has been populated with a first power semiconductor chip 1 on the first mounting area 11', an optional second power semiconductor chip 2 on the second mounting area 12', and also a shunt resistor 3 on the third mounting area 13'.

Moreover, the circuit is wired in a circuit-conforming manner with bonding wires 81, 82, 83, 85, 86. The bonding wires 81 are electrically connected in parallel and connected to a phase terminal P, as is shown in FIG. 1. The bonding wires 82 serve for connecting the load paths of the power semiconductor chips 1 and 2 in series to form a half-bridge and to connect the half-bridge to a positive supply potential V+ and to a negative supply potential V− in accordance with the circuit diagram according to FIG. 1. The bonding wires 83 are in each case connected to a control terminal (not illustrated in detail) of the first and second power semiconductor chips 1 and 2, respectively.

Furthermore, bonding wires 85, 86 are also provided, which serve for determining a potential difference dropped across the shunt resistor 3 and for tapping off electrical potentials V31 and V32, respectively as shown in FIG. 1. The intensity and the direction of the current I1, I2 flowing through the shunt resistor 3 can be determined from this potential difference. For this purpose, the bonding wire 85 is bonded to the second section 62 in the vicinity of the shunt resistor 3 along the mounting area 13'. The other bonding wire 86, by contrast, is bonded to the upper metallization 32 of the shunt resistor 3.

As can clearly be discerned in FIGS. 2A and 2B, the constriction 40 can be produced between the ends of two slots 51 and 52 running toward one another, the slots 51 and 52 introduced into the upper metallization layer 6 and which completely sever the latter in a vertical direction, that is to say perpendicularly to the top side 5a of the insulation carrier 5.

Figure 2C:
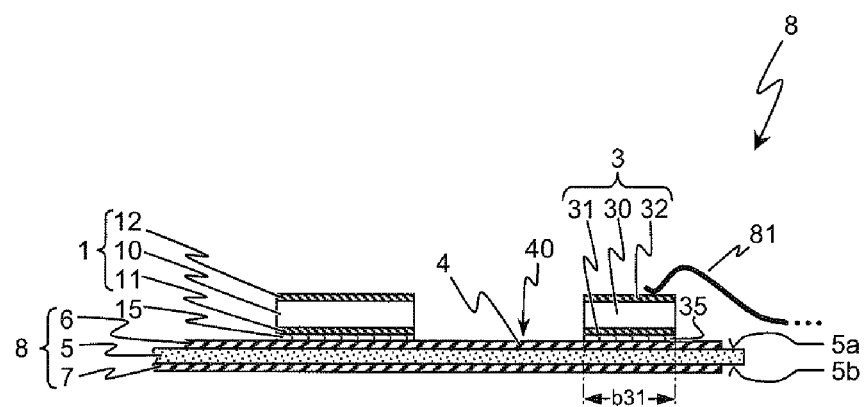
FIG. 2C shows a vertical section through the populated circuit carrier shown in FIG. 2B in a sectional plane E1.
Figure 2D:
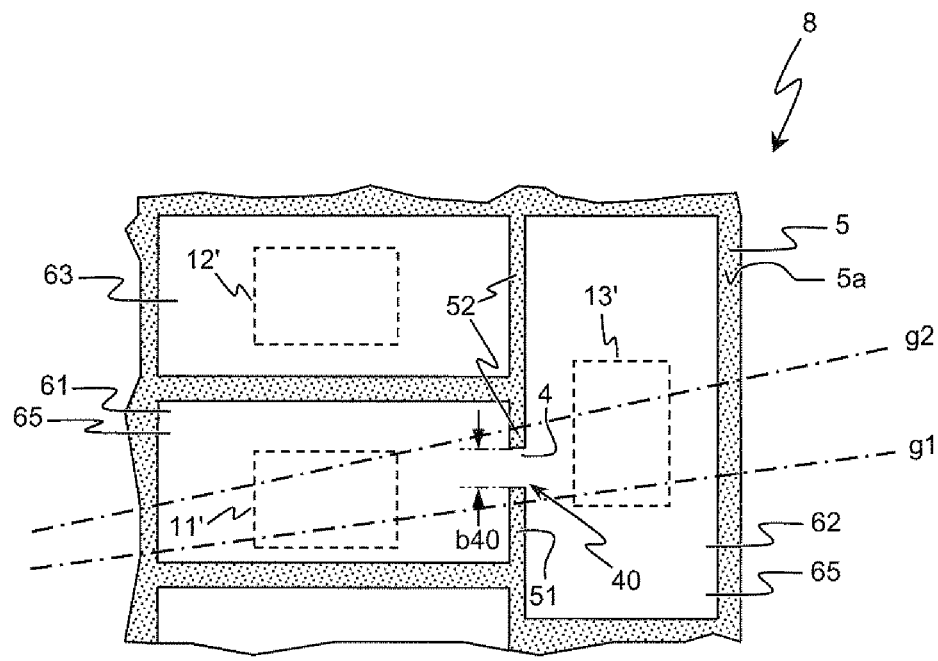
FIG. 2D shows the unpopulated circuit carrier in accordance with FIG. 2A in an illustration revealing that the constriction channels the current flowing in the metallization layer between the sections thereof that are connected to one another via the constriction, and thereby provides for a current distribution that is independent of the circuit state to the greatest possible extent in the region of the shunt resistor.

FIG. 2C shows a vertical section through the arrangement in accordance with FIG. 2B in a sectional plane E1. It can be discerned in this sectional view that the circuit carrier 8 can also have, in addition to the upper metallization layer 6, an optional, lower metallization layer 7 applied to the underside 5b of the insulation carrier 5. The lower metallization layer 7 can optionally be patterned or unpatterned.

The upper metallization layer 6 and the optional lower metallization layer 7 are fixedly connected to the top side 5a and the underside 5b, respectively, of the insulation carrier 5. The insulation carrier 5 can be a ceramic, for example. Examples of suitable ceramic materials therefor include aluminum nitride (AlN), aluminum oxide (Al2O3), silicon nitride (Si3N4), silicon carbide (SiC), or beryllium oxide (BeO).

The upper metallization layer 6 and the optional lower metallization layer 7 can comprise wholly or at least predominantly of copper or of aluminum. The circuit carrier 8 can be, for example, a DCB substrate (DCB=Direct Copper Bonding), an AMB substrate (AMB=Active Metal Brazing) or a DAB substrate (DAB=Direct Aluminum Bonding). Optionally, the metallization layers 6 and/or 7 can also be thinly coated with one or more of the materials such as silver, NiAu, NiPd, NiPdAu, in order to produce solderable surfaces or to facilitate the connection of the chips by means of a low-temperature pressure sintering connection technique.

The first power semiconductor chip 1 is a vertical power semiconductor component comprising a semiconductor body 10, which is provided with a lower load terminal 11 and with an upper load terminal 12. The load current of the first power semiconductor chip 1 flows via the load terminals 11, 12. The load terminals 11, 12 can be, for example, drain/source, emitter/collector or anode/cathode.

In order to electrically conductively connect the lower load terminal 11 to the associated mounting area 11' (see FIG. 2A), a solder layer 15 is provided. The second power semiconductor chip 2, which is hidden in FIG. 2C, correspondingly has a semiconductor body 20 provided with a lower load terminal 21 and with an upper load terminal 22.

Here, too, the lower load terminal 21 is connected to the associated mounting area 12' by a solder layer 25.

The shunt resistor 3 is likewise embodied as a vertical component and has a doped semiconductor body 30, which constitutes the resistance element of the shunt resistor 3. The semiconductor body 30 can be produced, for example, from the base material silicon, but also from any other semiconductor material, such as, for example, silicon carbide, germanium, gallium arsenide, etc. In principle, however, it is also possible to use any other material for producing the resistance element 30.

Although the resistance characteristic curve of semiconductor material is temperature-dependent, power semiconductor modules for example in many cases have anyway a temperature measurement for example by means of an NTC thermistor sensor, for example a silicon temperature sensor, such that a temperature drift during the resistance measurement can readily be compensated for.

The shunt resistor 3 additionally has a lower main terminal 31 on the underside of the resistance element 30 facing the circuit carrier 8, and an upper main terminal 32, which is situated on the top side of the semiconductor body 30 remote from the circuit carrier 8. The lower main terminal 31 is electrically conductively connected to the associated mounting area 13' by a solder 35.

Such a shunt resistor 3 therefore has, in the same way as the power semiconductor chips 1, 2, in each case an upper and a lower terminal and also a semiconductor body. This has the advantage that the shunt resistor 3 can be mounted and interconnected on the circuit carrier 8 using the same process technology and in the same placement step as the power semiconductor chips 1, 2. In contrast to conventional shunt resistors that are connected to the circuit carrier 8 by a conventional technology such as by simple soldering, for example, the shunt resistors 3 described herein are compatible with modern process technologies requiring high temperatures such as, for example, diffusion soldering or low-temperature pressure sintering (LTJT).

The load terminals 11, 12, 21, 22 of the power semiconductor chips 1, 2 and also the main terminals 31, 32 of the shunt resistor 3 can be metallizations of the respective semiconductor body 10, 20 and 30. Instead of the solder layers 15, 25 and 35, respectively, it is also possible to use any other electrically conductive connecting means such as an electrically conductive adhesive, for example, or pressure sintering layers produced with a paste containing a silver powder and a solvent.

FIG. 2D shows again the unpopulated circuit carrier 8 from FIGS. 2A to 2C in plan view. In accordance with one possible configuration, the position and the width b40 of the constriction 40 are chosen such that for each of the slots 51, 52, between the ends of which the constriction 40 is formed, there exists a straight line g1 and g2, respectively, which extends from the mounting area 11' and 12', respectively, to the mounting area 13' and which intersects the first and second slots 51 and 52, respectively.

Figure 3:
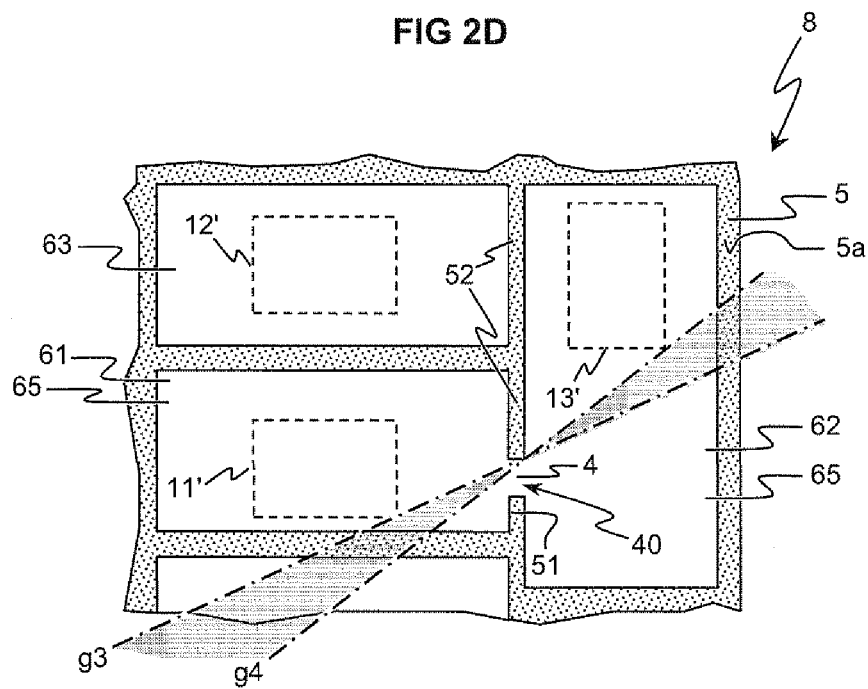
FIG. 3 shows the unpopulated circuit carrier in accordance with FIGS. 2A and 2D, in which the mounting area provided for mounting the shunt resistor is situated at a different position than in the case of the circuit carriers in accordance with FIGS. 2A and 2D.

FIG. 3 shows in plan view another embodiment of a circuit carrier 8, which differs from the circuit carrier 8 in accordance with FIGS. 2A to 2D in the position of the constriction 40 and hence in the position of the electrically conductive connection 4 between the sections 61 and 62, and also in the position of the mounting area 13' on the second section 62. According to this embodiment, no straight line can be defined which extends from the first mounting area 11' to the mounting area 13' and in the process intersects the constriction 40. Therefore, the mounting area 13' is situated as it were "in the blind spot" as viewed from the mounting area 11'.

Figure 4:
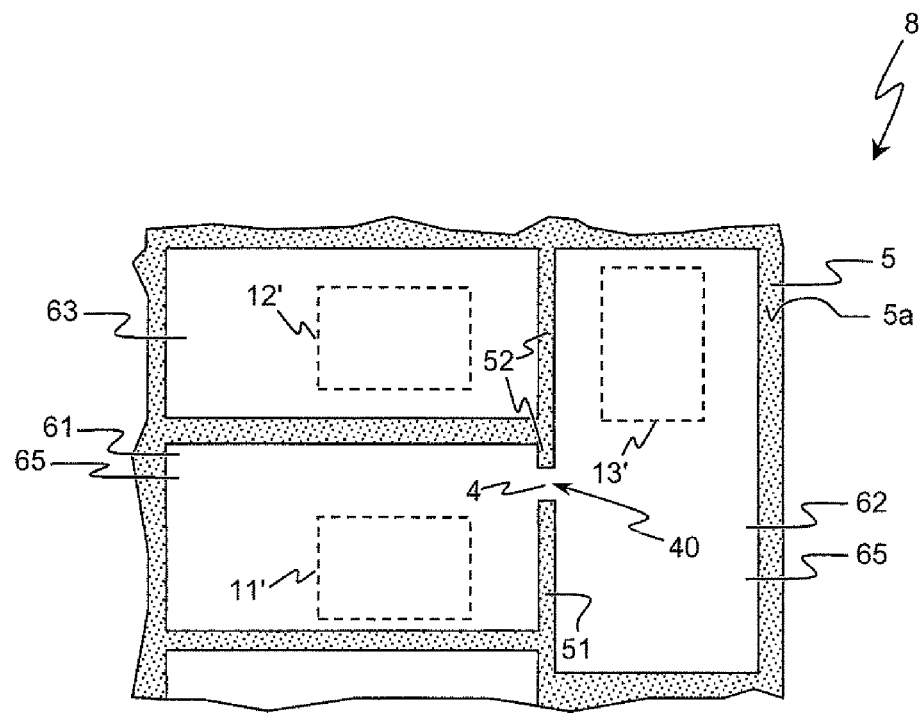
FIG. 4 shows a further circuit carrier, which differs from the circuit carriers in accordance with FIGS. 2A, 2D and 3 by a different position of the constriction.
Figure 5:
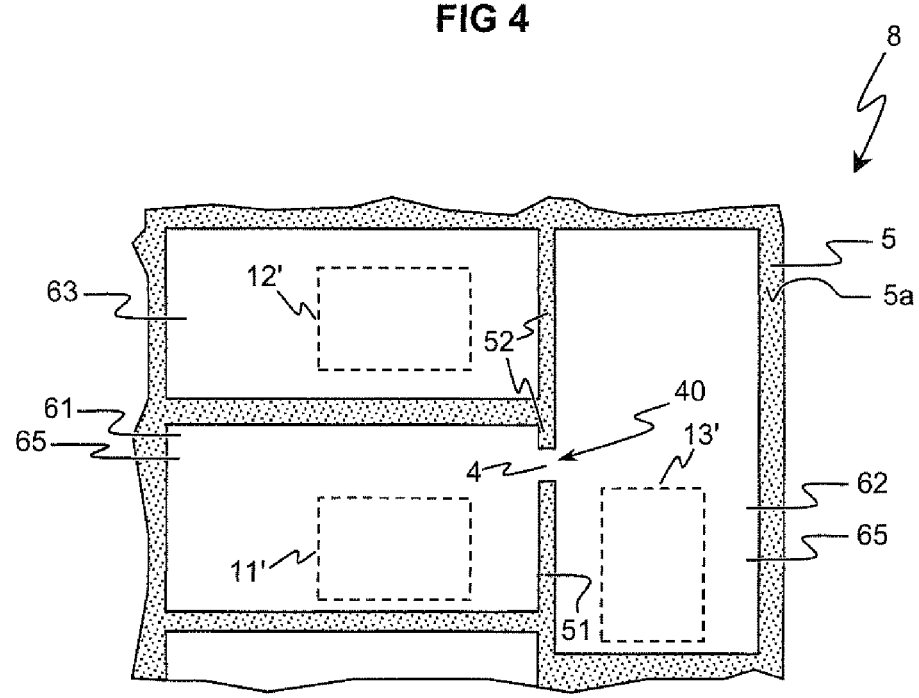
FIG. 5 shows an unpopulated circuit carrier which is identical to the circuit carrier in accordance with FIG. 4, but in which a different position for mounting the shunt resistor is provided.

The circuit carriers 8 shown in FIGS. 4 and 5 have the same patterning of the upper metallization layer 6. They differ however in the position of the mounting area 13' on the second section 62. It has been found that, on account of a constriction 40 as described herein, the measurement error dependent on the current flow direction during the determination of the resistance value of the shunt resistor 3 is largely independent of the position of the mounting area 13' thereof on the section 62 of the upper metallization layer 6.

In the arrangement in accordance with FIG. 5, the slot 51 extends over the entire length of that lateral side area of the shunt resistor 3 which faces the slot 51. The same correspondingly holds true with regard to the slot 52 in the case of the arrangement in accordance with FIG. 4.

Figure 6:
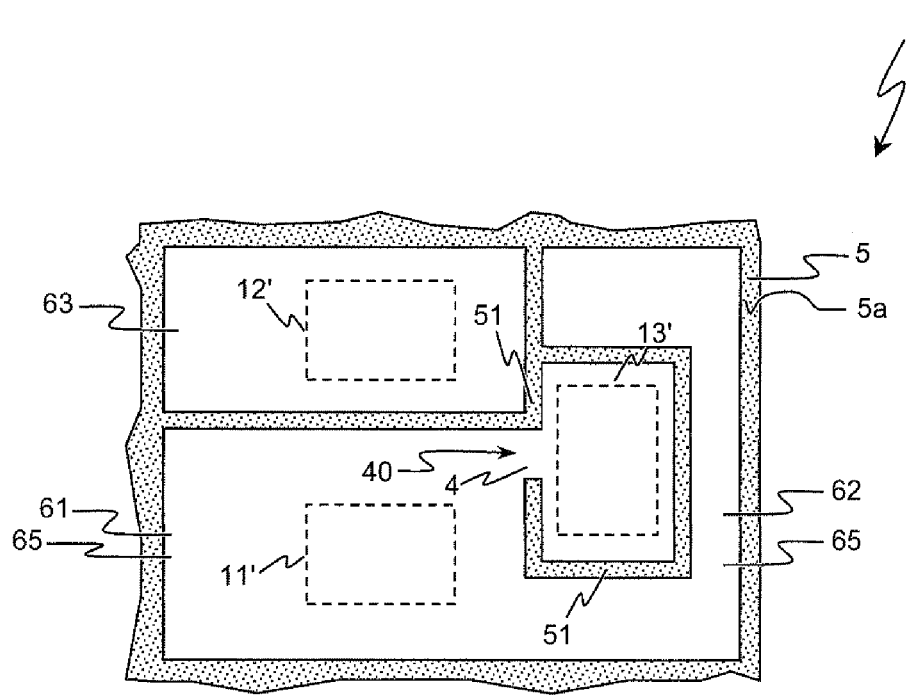
FIG. 6 shows an unpopulated circuit carrier in which the mounting area for the shunt resistor is surrounded by a slot that completely encloses the mounting area with the exception of the constriction.

In the embodiment shown in FIG. 6, the mounting area 13' for mounting the shunt resistor 3 is surrounded on four sides in a ring-shaped manner by a slot 51, which forms a closed ring around the mounting area 13' with the exception of the constriction 40.

Figure 7:
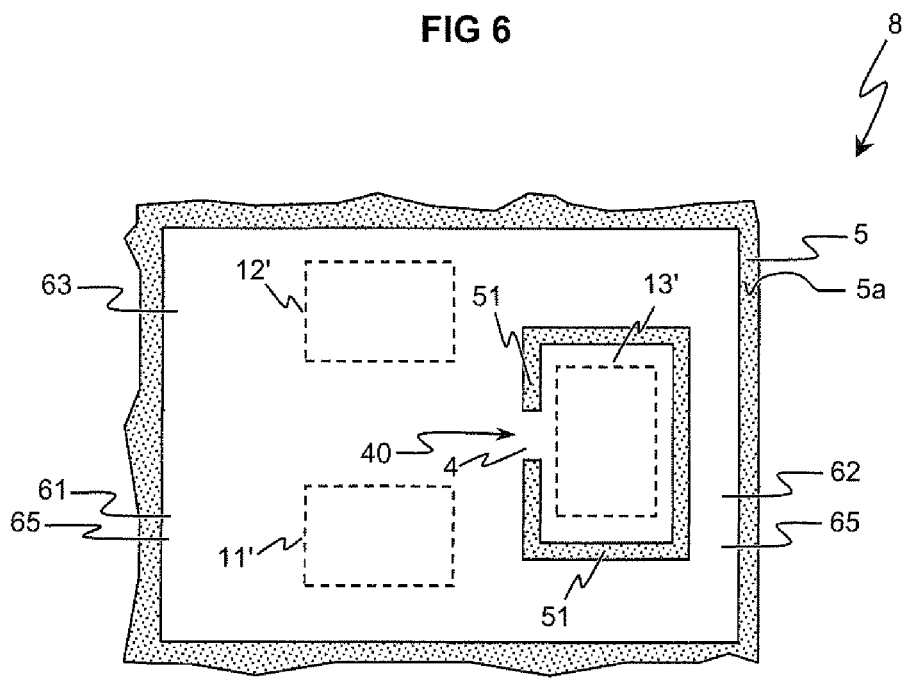
FIG. 7 shows an unpopulated circuit carrier which differs from the unpopulated circuit carrier in accordance with FIG. 6 in that mounting areas for mounting two power semiconductor chips are provided on a continuous section of the metallization layer.

In all of the layouts shown previously, the third mounting area 63 provided for mounting an optional second power semiconductor chip 2 is spaced apart from the continuous section 65 and thus from the sections 61 and 62 thereof. However, as shown in FIG. 7, this is not absolutely necessary. In this embodiment, both mounting areas 11' and 12' for the first and second power semiconductor chips 1 and 2, respectively, are provided on the same first section 61 of the metallization layer 6. In this embodiment, too, the mounting area 13' is surrounded by a slot 51, which completely severs the metallization layer 6 in a vertical direction perpendicular to the top side 5a of the insulation carrier 5, over its entire length, and which, apart from the constriction 40, encloses the mounting area 13' in a ring-shaped manner.

Figure 8:
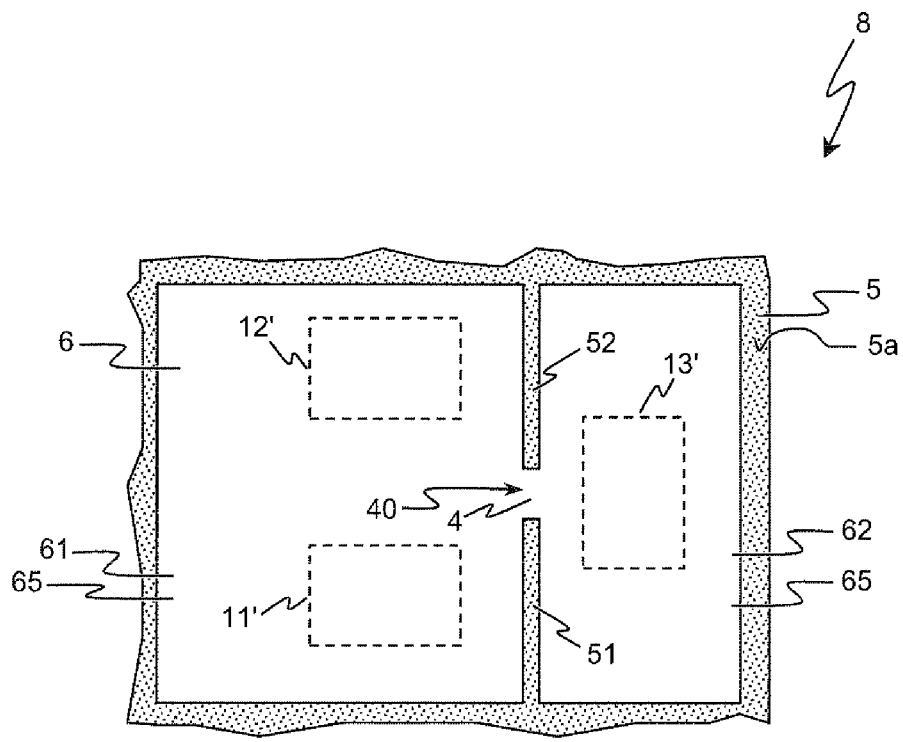
FIG. 8 shows an unpopulated circuit carrier in which that section of the metallization on which the shunt resistor is intended to be arranged is separated by two elongated slots running toward one another, between the ends of which the constriction is formed, relative to another section of the metallization layer, on which mounting areas for two power semiconductor chips are provided.
Figure 9:
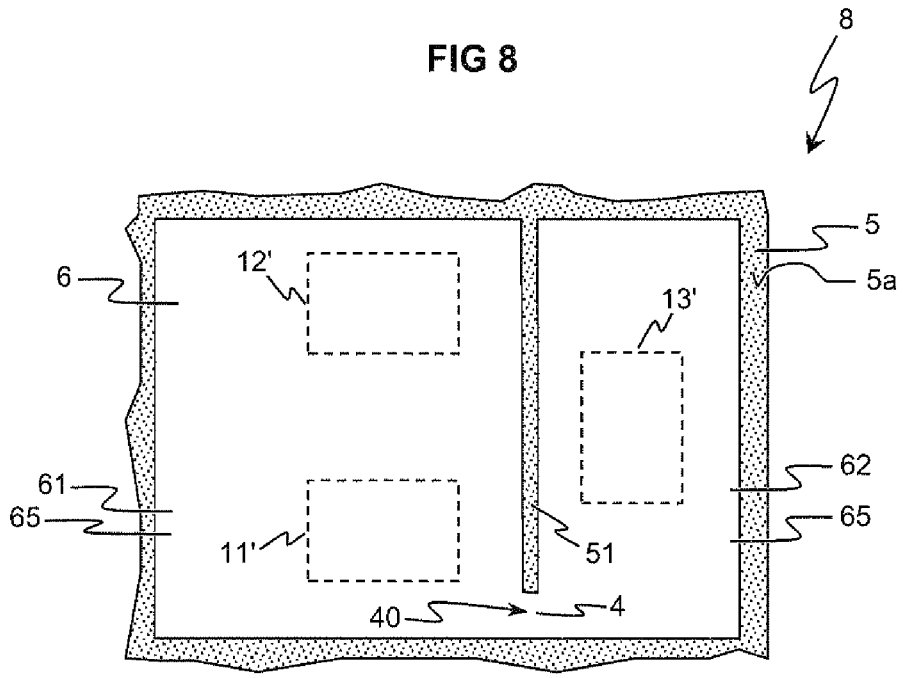
FIG. 9 shows an unpopulated circuit carrier in which the constriction is situated between one end of an elongated slot in the upper metallization and a lateral edge of the continuous section.

FIGS. 8 and 9 show further configurations, in which the mounting areas 11' and 12' for mounting the first and second power semiconductor chips 1 and 2, respectively, are arranged on the same section 61 of the upper metallization layer 6, while the mounting area 13' provided for mounting a shunt resistor 3 is situated on a second section 62 of the upper metallization layer 6, which is connected to the first section 61 merely via the electrically conductive connection 4 at the constriction 40. In the layouts in accordance with the embodiments of FIGS. 8 and 9, the mounting areas 11' 12', 13' are situated at the same positions relative to one another. The difference between the two arrangements is that the constriction 40 is situated at different positions, and that the constriction 40 is formed between the ends of two slots 51 and 52 running toward one another in the upper metallization layer 6 in the case of the arrangement in accordance with FIG. 8, while the constriction 40 is situated between the end of a slot 51 in the upper metallization layer 6 and a side edge of the continuous section 65 in the case of the arrangement in accordance with FIG. 9.

Figure 10:
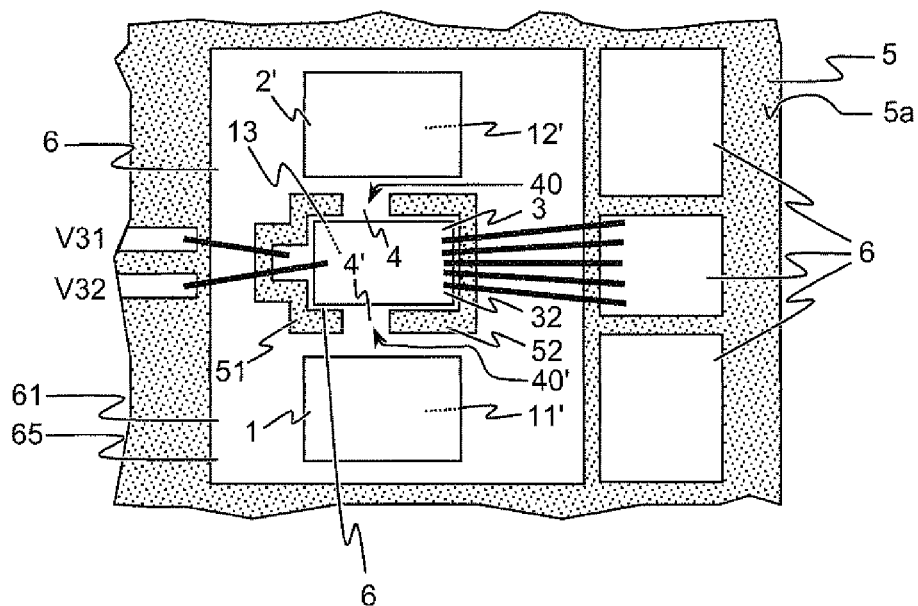
FIG. 10 shows a populated circuit carrier in which the shunt resistor is arranged between two power semiconductor chips, each of which is connected to the shunt resistor via a constriction of the metallization layer.

A further embodiments shown in FIG. 10. Here the shunt resistor 3 is arranged between two power semiconductor chips 1 and 2' on a mounting area 13 of a second section 62 of the upper metallization layer 6. The second section 62 is connected to a first section 61 of the upper metallization layer 6 by two constrictions 40 and 40'. The mounting areas 11' and 12' for the first and second power semiconductor chips 1 and 2, respectively, are situated in each case on the first section 61, such that the first constriction 40 is situated between the mounting areas 12' and 13', whereas the second constriction 40' is situated between the mounting areas 11' and 13'.

Figure 11A:
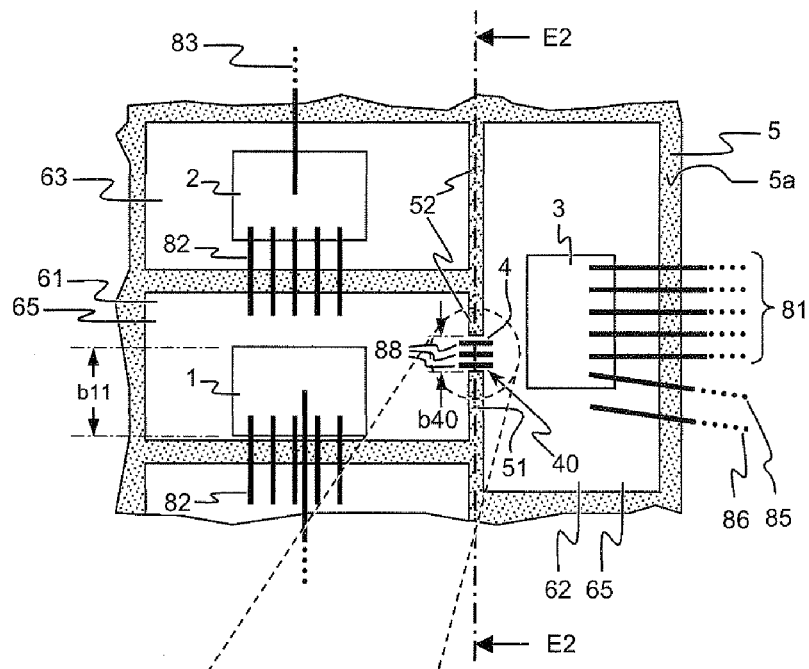
FIG. 11A shows the populated circuit carrier in accordance with FIGS. 2A and 2D after the circuit carrier has been populated with a shunt resistor and two power semiconductor chips, wherein the constriction is bridged with the aid of bonding wires in order to reduce the electrical resistance.

The current distribution is accurately defined by concentrating the current on a specific region that is as narrow as possible. In order nevertheless to achieve a sufficiently low conduction resistance in the region of the constriction, provision can optionally be made for reducing the conduction resistance across the constriction by applying one or more bonding wires 88 or flat bonding ribbons (the latter are not illustrated) which extend across the constriction 40 and which are electrically conductively connected to the continuous section 65 in each case at both sides of the constriction 40. FIG. 11a shows one embodiment of this, where by way of example three bonding wires 88 extend across the constriction 40 and each of the bonding wires 88 is bonded to the continuous section 65 of the upper metallization layer 6 at both sides of the constriction 40. To put it another way, each of the bonding wires 88 is bonded both to the first section 61 and to the second section 62.

Figure 11B:
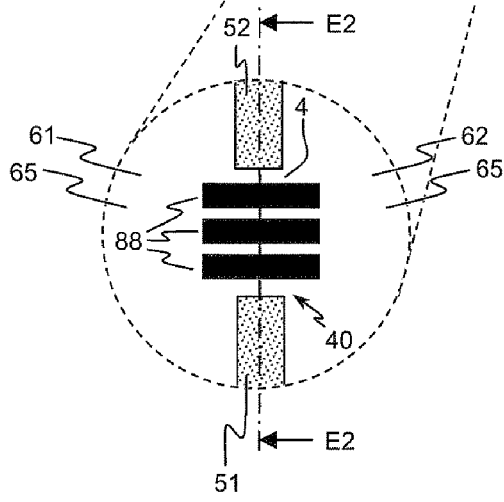
FIG. 11B shows an enlarged illustration of the constriction with the bonding wires bridging it.
Figure 11C:
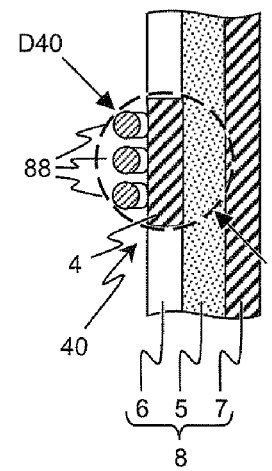
FIG. 11C shows a vertical section through the populated circuit carrier in the region of the constriction in a sectional plane E2 illustrated in FIGS. 11A and 11B.

FIG. 11B shows an enlarged excerpt from the region of the constriction 40. FIG. 11C is a sectional view through the enlarged section in accordance with FIG. 11B in a sectional plane E2 in the region of the constriction 40. The entire electrical connection 4 between the first section 61 and the second section 62 is effected exclusively in the region of the constriction 40, as a result of which a maximum concentration of the current on the region of the constriction 40 can be realized. In this arrangement, the electrically conductive connection 4 includes both the connecting web in the upper metallization layer 6, the connecting web being formed between the first section 61 and the second section 62, and the bonding wires 88.

Accordingly, for the entire electrically conductive connection between the first section 61 and the second section 62, there exists at least one sectional plane E2 in which the entire cross-sectional area of the electrically conductive connection 4 can be arranged within a circle having a predefined diameter D40. The diameter D40 can be, for example, in the range of 650 µm to 90% of the length l31 of the shunt resistor 3.

Another embodiment in this respect is shown in FIG. 12A, which in turn shows an enlarged excerpt from a circuit arrangement corresponding to the excerpt in accordance with FIG. 11B. In contrast thereto, a solder layer 89 is applied to the upper metallization layer 6 across the constriction 40, and makes contact with the continuous section 65 at both sides of the constriction 40. FIG. 12B shows a vertical section through the constriction with the solder 89 applied thereto in a sectional plane E3. The solder layer 89 is therefore electrically conductively connected to the continuous section 65 on each side of the constriction 40. To put it another way, the solder layer 89 makes contact both with the first section 61 and with the second section 62.

Yet another embodiment is shown in FIG. 13A, where an electrically conductive metal lamina 90 is provided, which extends across the constriction 40 and which is electrically conductively connected to the continuous section 65 on both sides of the constriction 40. The electrically conductive connection can be effected by a solder 89, for example. FIG. 13B shows a sectional view of the arrangement in accordance with FIG. 13A in a sectional plane E4. This sectional view reveals that the solder 89 is situated between the metal lamina 90 and the upper metallization layer 6. Instead of a solder 89, it is also possible, for example, to use a pressure sintering layer or an electrically conductive adhesive for producing the electrically conductive connection between the metal lamina 90 and the upper metallization layer 6. To put it another way, the metal lamina 90 is soldered both onto the first section 61 and onto the second section 62.

In a manner corresponding to the arrangement in accordance with FIG. 11C, in the arrangements in accordance with FIGS. 12B and 13B, too, a circumcircle is in each case illustrated which has a diameter D40 and in which the entire cross-sectional area of the entire electrical connection 4 between the first section 61 and the second section 62 is situated in each case. The dimensions for the diameter D40 as specified for the arrangement in accordance with FIG. 11C apply in the same way to the arrangements in accordance with FIGS. 12B and 13B.

Figure 14:
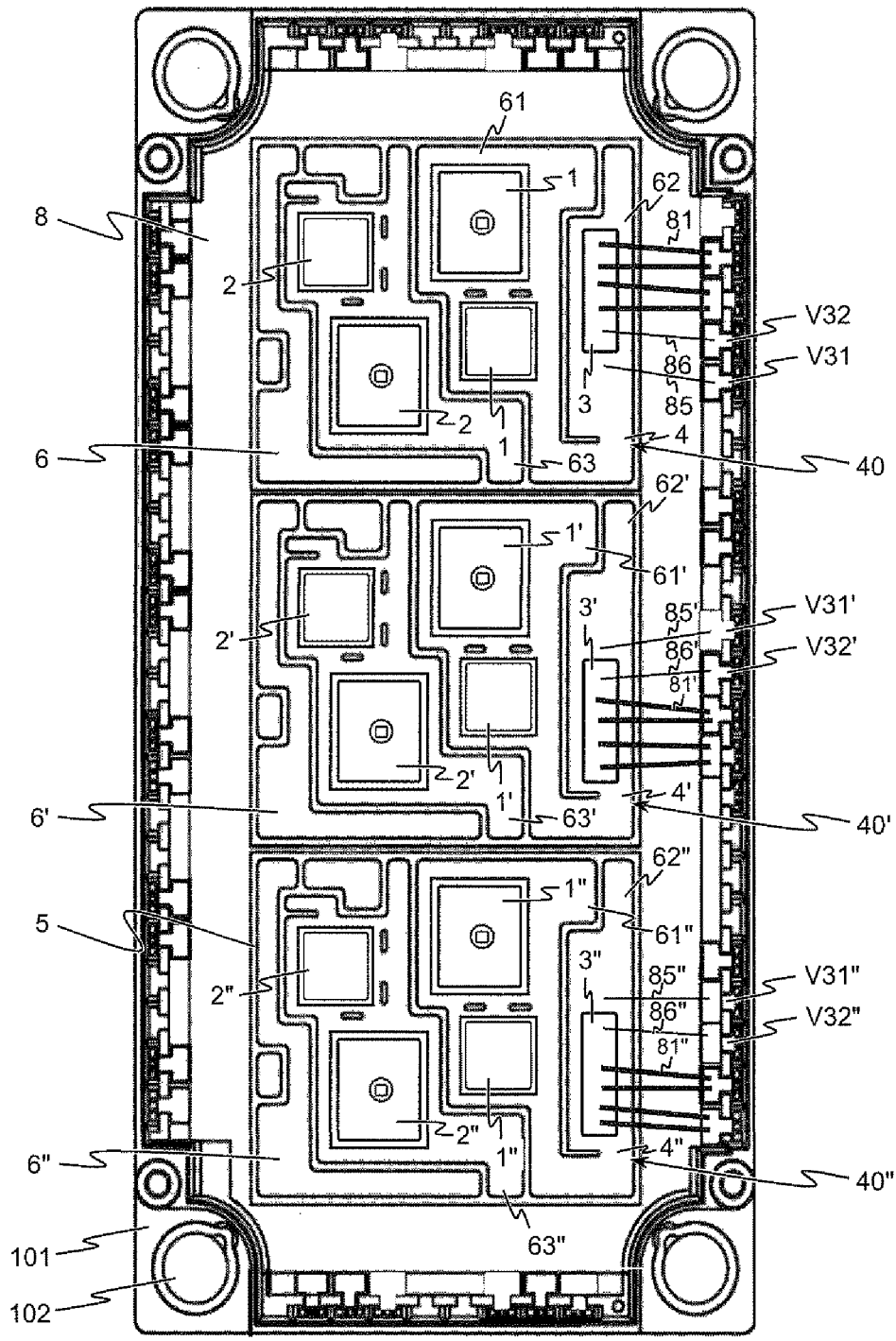
FIG. 14 shows a plan view of one power semiconductor module, which has three circuit arrangements, each of which is populated with a half-bridge, wherein the layout of the metallization in the three circuit carriers is identical and the respective shunt resistor is situated at different positions on the corresponding layout.

FIG. 14 shows a power semiconductor module including a housing 101, which has mounting holes 102, and in which the cover has been removed. Three circuit arrangements each having an identical patterning of the upper metallization layer 6 are situated one under another in the module. For the upper one of these circuit arrangements, the same reference symbols as in the previous Figures are used, and likewise in the middle and lower circuit arrangements, but the latter, for differentiation, are additionally provided with a single and a double prime symbol, respectively. In the example shown, the upper metallization layers 6, 6' and 6" for the different circuit arrangements are arranged on the same insulation carrier 5. As an alternative thereto, however, it would also be possible to provide a separate insulation carrier 5, 5' and 5" for each of the three circuit carriers.

In this exemplary embodiment, the reference symbols 1, 1' and 1" respectively designate power semiconductor chips arranged on a first section 61, 61' and 61", respectively, while the reference symbols 2, 2' and 2" designate power semiconductor chips situated on the third section 63, 63' and 63", respectively. Shunt resistors are correspondingly designated by the reference symbol 3, 3' and 3", the shunt resistors being situated on the second sections 62, 62' and 62", respectively, of the upper metallization layer 6, 6' and 6", respectively.

The larger power semiconductor chips from among those designated by the reference symbols 1, 1', 1", 2, 2' and 2" are in each case a controllable power semiconductor chip (e.g. MOSFET, IGBT, J-FET, SiC J-FET), which can also be discerned from the control terminal respectively illustrated in the center of their top side, the control terminal being situated within the respective upper load terminal in this example. The smaller power semiconductor chips from among those designated by the reference symbols 1, 1', 1", 2, 2' and 2", by contrast, are in each case freewheeling diodes connected to the relevant larger one of the power semiconductor chips 1, 1', 1", 2, 2', 2" that is located closest to the respective diode.

Alternatively, instead of parallel connections of in each case a controllable power semiconductor chip and a freewheeling diode, it is also possible, for example, for in each case an SiC J-FET and a MOSFET, in particular an SiC J-FET and an Si-MOSFET, to be connected in parallel.

As mentioned, the upper metallizations 6, 6' and 6" are patterned identically and optionally populated identically with power semiconductor chips 1/2, 1'/2', 1"/2". In the example shown, the three circuit arrangements do not differ with regard to the arrangement of the respective power semiconductor chips 1/2, 1'/2', 1"/2" relative to one another. However, there is a difference in the positions of the relevant shunt resistors 3, 3' and 3" on the respective second section 62, 62' and 62" of the relevant upper metallization layer 6, 6' and 6", respectively.

For electrically interconnecting the shunt resistors 3, 3', 3" in the power semiconductor module, besides the respective upper metallization layer 6, 6' and 6", bonding wires 81, 81', 81", 85, 85', 85", 86, 86', 86" are provided, which, on the circuit carrier side according to the arrangement in accordance with FIG. 2B, are bonded to the top side of the respective shunt resistor 3, 3', 3" and, alongside the relevant shunt resistor 3, 3', 3", to the second section 62, 62', 62" of the associated upper metallization 6, 6', 6". The other sides of the bonding wires 81, 81', 81", 85, 85', 85", 86, 86', 86" are bonded, for the purpose of module-external contact-connectability, to foot regions of terminal lugs inserted into a housing frame of the module. Further bonding wires contained in the module are not illustrated for reasons of clarity. Suitable materials for bonding wires which are used in the present invention include, in particular, aluminum and/or copper.

Instead of bonding wires, in the arrangement in accordance with FIG. 14, in the same way as in all the other arrangements, bonding wires can be replaced by other electrical connecting lines. By way of example, mention shall be made of flat ribbons or metal sheets that are soldered, diffusion-soldered, bonded, ultrasonically welded, or connected by means of a low-temperature pressure sintering connection.

In a power semiconductor module, it is additionally possible to provide terminals such as the terminal lugs mentioned, for example, which serve for externally making contact with the module. These terminals can be embodied as soldering or screw terminals, or as press-fit or spring contacts, at the sides provided for making contact with the module externally.

As a consequence of the constrictions 40 provided in the circuit arrangements described herein, a very flat gradient of the electrical potential in the region of the shunt resistor 3 occurs, such that a positional inaccuracy caused by manufacturing technology when fitting the taps 85/86, 85'/86', 85"/86" for detecting the voltage dropped across the shunt resistor 3 does not lead to significant variations in the voltage measurement and, associated therewith, the current measurement.

In all the circuit arrangements explained above, the entire electrically conductive connection 4 between the first section 61 and the second section 62 electrically conductively connects the sections 61 and 62 to one another permanently.

The electrically conductive connection 4 need not necessarily include a section of the upper metallization layer 6. In principle, a constriction 40 can also be realized with the aid of one or more of the electrically conductive connecting means (bonding wires or ribbons 88, solder, adhesive or sintering layers 89, metal laminae 90) explained with reference to FIGS. 11A to 13B.

Figure 15:
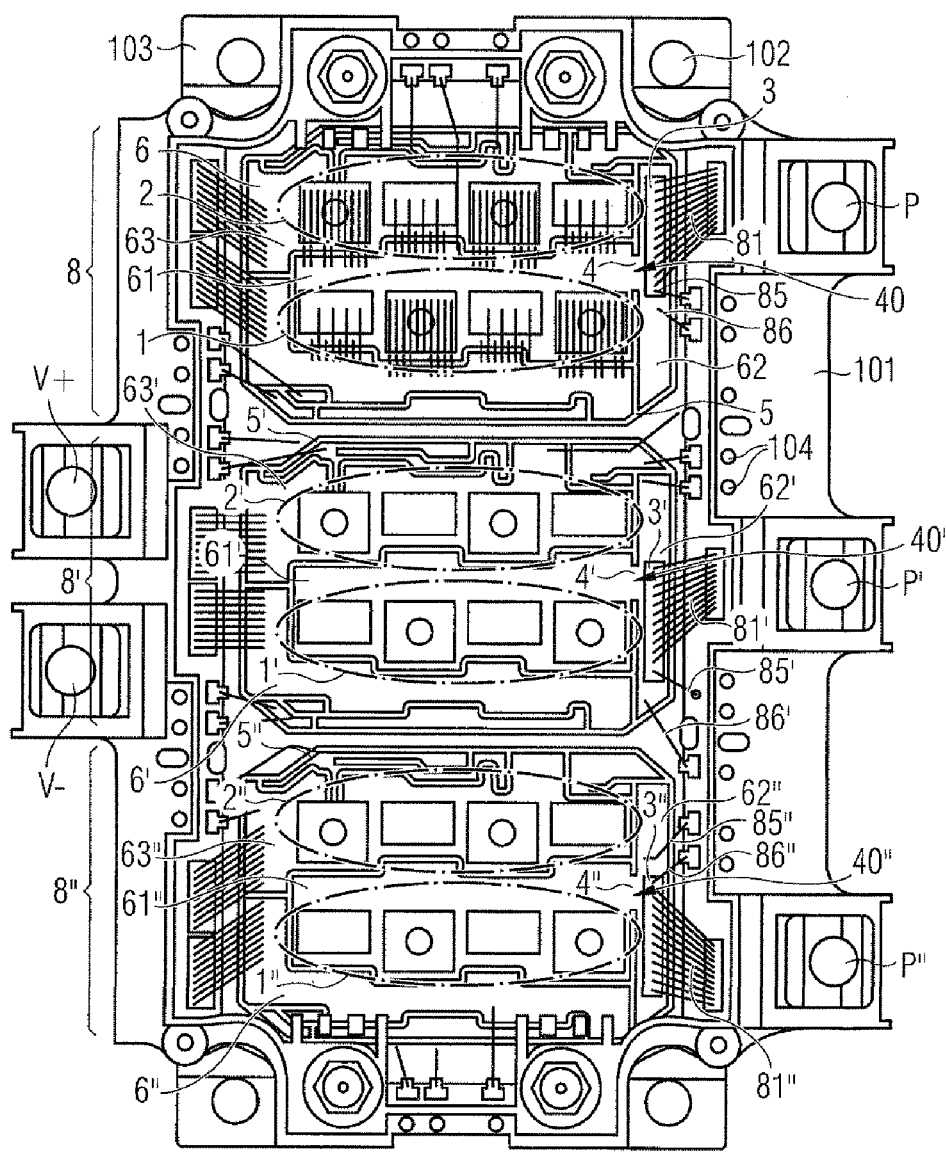
FIG. 15 shows a plan view of another power semiconductor module, which is embodied as a converter module and which has three circuit arrangements, of which the first, second and third sections of the upper metallization are respectively embodied identically, and wherein the second section is in each case populated with a shunt resistor, which is situated at different positions on the second section in the three circuit arrangements.

FIG. 15 shows a plan view of another power semiconductor module. The latter differs from the power semiconductor module in accordance with FIG. 14 in that three separate circuit carriers 8, 8' and 8" with a respective insulation carrier 5, 5' and 5" are provided, and also in the number of power semiconductor chips 1, 2, 1', 2', 1", 2". All the power semiconductor chips which are arranged on the same first or third section 61, 61', 61" or 63, 63', 63" of the upper metallizations 6, 6', 6" and are electrically connected in parallel by their load paths are respectively identified by a dashed oval identified by the reference symbol 1, 2, 1', 2', 1" or 2" for the relevant power semiconductor chips.

The module has a total of three half-bridges each of which has a phase output P, P' or P", each of which simultaneously forms a main terminal of the entire power semiconductor module. The voltage supply of the three half-bridges is fed via further main terminals V+ and V− of the power semiconductor module and connected to the individual half-bridges via further sections of the upper metallizations 6, 6' or 6".

While the main terminals V+, V−, P, P', P" are embodied as screw terminals, all the other electrical terminals of the module are realized with the aid of a multiplicity of press-fit contacts 104 which were injected into the housing frame 101 during the production thereof and which are arranged in a distributed fashion circumferentially along the housing frame 101 around the totality of the circuit carriers 8, 8', 8". The press-fit contacts can be press-fitted e.g. in a gastight manner into contact holes of a printed circuit board which contains, for example, open-loop and/or closed-loop control and/or monitoring electronics and/or a protective circuit for the module.

The power semiconductor module in accordance with FIG. 15 additionally has a metallic base plate 103, which comprises wholly or at least substantially of copper and via which the heat arising in the module can be dissipated to a heat sink. Mounting holes 102 are provided in order to screw the power semiconductor module to such a heat sink.

In the same way as in the power semiconductor module in accordance with FIG. 14, in the power semiconductor module in accordance with FIG. 15, too, the individual shunt resistors 3, 3', 3" are arranged on identically shaped second sections 62, 62', 62", and also at different positions relative thereto. At their top sides, the shunt resistors 3, 3', 3" are connected, by a plurality of bonding wires 81, 81' and 81" electrically connected in parallel, to foot regions of the main terminals forming the phase outputs P, P' and P" respectively. For this purpose, the main terminals accessible from the module exterior extend through the housing frame 101 right into the interior of the module, where at least their foot regions are exposed and thus accessible to the bonding of the bonding wires 81, 81', 81".

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement with a populated circuit carrier, comprising:
a flat insulation carrier having a top side and a patterned metallization layer on the top side;
a first power semiconductor chip arranged on a first section of the metallization layer, the first power semiconductor chip having a first lower chip load terminal electrically conductively connected to the first section;
a shunt resistor arranged on a second section of the metallization layer, the shunt resistor having a lower main terminal electrically conductively connected to the second section; and
an electrically conductive connection between the first section and the second section, the electrically conductive connection having a constriction of the metallization layer between the first section and the second section so that a current which flows between the first lower chip load terminal and the lower main terminal during operation of the circuit arrangement must pass through the constriction.

2. The circuit arrangement as claimed in claim 1, wherein the first section, the second section and the constriction are parts of a continuous section of the patterned metallization layer.

3. The circuit arrangement as claimed in claim 2, wherein the continuous section has at the constriction a width which is less than a smallest width of the first lower chip load terminal and less than a smallest width of the lower main terminal.

4. The circuit arrangement as claimed in claim 3, wherein the width of the continuous section at the constriction is greater than 650 μm.

5. The circuit arrangement as claimed in claim 2, wherein the continuous section has an elongated first slot extending as far as the constriction and completely severing the continuous section over an entire length of the first slot in a direction perpendicular to the top side of the insulation carrier.

6. The circuit arrangement as claimed in claim 5, wherein a straight line is defined which extends from the first section to the second section and which intersects the first slot.

7. The circuit arrangement as claimed in claim 5, wherein no straight line is defined which extends from the first section to the second section and in the process intersects the constriction.

8. The circuit arrangement as claimed in claim 5, wherein the first slot runs along one, two, three or four sides of the shunt resistor.

9. The circuit arrangement as claimed in claim 5, wherein the first slot extends around the second section so that the constriction is arranged between opposite ends of the first slot.

10. The circuit arrangement as claimed in claim 5, wherein the continuous section has an elongated second slot extending as far as the constriction and completely severing the continuous section over an entire length of the second slot in the direction perpendicular to the top side of the insulation carrier.

11. The circuit arrangement as claimed in claim 2, wherein the electrically conductive connection between the first section and the second section is formed solely by the continuous section.

12. The circuit arrangement as claimed in claim 1, wherein the electrically conductive connection comprises at least one electrically conductive element each of which on one side of the constriction is electrically conductively applied to the metallization layer and is electrically conductively connected there to the first section, and on the other side of the constriction is electrically conductively applied to the metallization layer and is electrically conductively connected there to the second section.

13. The circuit arrangement as claimed in claim 12, wherein the at least one electrically conductive element is a bonding wire or flat ribbon bonded to the metallization layer, a solder layer applied to the metallization layer, or a metal lamina electrically conductively soldered, adhesively bonded or sintered to the metallization layer and thereto.

14. The circuit arrangement as claimed in claim 1, further comprising a second power semiconductor chip connected in series with the first power semiconductor chip to form a half-bridge, the second power semiconductor chip arranged on a third section of the metallization layer spaced apart from the first section, the second power semiconductor chip having a second lower chip load terminal electrically conductively connected to the third section.

15. The circuit arrangement as claimed in claim 1, wherein the shunt resistor has a width and a length greater than the width, and wherein the electrically conductive connection at the constriction has a cross-sectional area having a circumferential diameter of less than 90% of the length and/or of more than 650 μm.

16. The circuit arrangement as claimed in claim 1, wherein the shunt resistor comprises a doped semiconductor body, the lower main terminal is applied to a first side of the doped semiconductor body and an upper main terminal is applied to the semiconductor body on that side of the doped semiconductor body which is remote from the lower main terminal.

17. A power semiconductor module comprising:
a housing; and
a plurality of circuit arrangements each having a populated circuit carrier included in the housing, each circuit arrangement comprising:
a flat insulation carrier having a top side and a patterned metallization layer on the top side;
a first power semiconductor chip arranged on a first section of the metallization layer, the first power semiconductor chip having a first lower chip load terminal electrically conductively connected to the first section;
a shunt resistor arranged on a second section of the metallization layer, the shunt resistor having a lower main terminal electrically conductively connected to the second section; and
an electrically conductive connection between the first section and the second section, the electrically conductive connection having a constriction of the metallization layer between the first section and the second section so that a current that flows between the first lower chip load terminal and the lower main terminal during operation must pass through the constriction.

18. The power semiconductor module as claimed in claim 17, wherein at least two of the plurality of circuit arrangements are constructed identically with regard to the respective flat insulation carrier and the respective patterned metallization layer, and the respective shunt resistors of the at least two circuit arrangements are arranged at different locations in relation to the respective second section.

19. The power semiconductor module as claimed in claim 17, wherein the insulation carrier for at least two of the plurality of circuit arrangements are embodied integrally.

20. The power semiconductor module as claimed in claim 17, wherein each circuit arrangement has a separate flat insulation carrier.

\* \* \* \* \*